(12) United States Patent
Rofougaran

(10) Patent No.: US 8,582,546 B2
(45) Date of Patent: *Nov. 12, 2013

(54) METHOD AND SYSTEM FOR INTER-PCB COMMUNICATIONS WITH WIRELINE CONTROL

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/405,048

(22) Filed: Feb. 24, 2012

(65) Prior Publication Data

US 2012/0159023 A1  Jun. 21, 2012

Related U.S. Application Data

(63) Continuation of application No. 12/056,865, filed on Mar. 27, 2008, now Pat. No. 8,144,674.

(51) Int. Cl.
 *H04W 4/00* (2009.01)
(52) U.S. Cl.
 USPC .......................................................... 370/338
(58) Field of Classification Search
 None
 See application file for complete search history.

(56) References Cited

U.S. PATENT DOCUMENTS

| | | | | |
|---|---|---|---|---|
| 6,590,543 | B1* | 7/2003 | Apostolos | 343/742 |
| 7,558,484 | B2* | 7/2009 | Lin et al. | 370/338 |
| 2004/0131035 | A1* | 7/2004 | Wakeley et al. | 370/338 |
| 2004/0219068 | A1* | 11/2004 | Gerwen | 422/82.12 |
| 2006/0079278 | A1* | 4/2006 | Ferguson et al. | 455/557 |
| 2008/0181185 | A1* | 7/2008 | Rofougaran | 370/338 |
| 2008/0274712 | A1* | 11/2008 | Rofougaran | 455/333 |
| 2009/0028177 | A1* | 1/2009 | Pettus et al. | 370/463 |
| 2010/0022204 | A1* | 1/2010 | Rofougaran | 455/90.2 |
| 2012/0214415 | A1* | 8/2012 | Harvey | 455/41.2 |

* cited by examiner

*Primary Examiner* — Anh-Vu Ly
(74) *Attorney, Agent, or Firm* — Farjami & Farjami LLP

(57) ABSTRACT

Aspects of a method and system for inter-PCB communications with wireline control may include setting up a microwave communication link between a first PCB and a second PCB via a wireline communication bus. The initialization may comprise adjusting beamforming parameters of a first antenna array communicatively coupled to the first PCB, and of a second antenna array communicatively coupled to the second PCB. The first PCB and the second PCB may communicate data via the microwave communication link. The microwave communication link may be routed via one or more relay PCBs, when the first PCB and the second PCB cannot directly communicate satisfactorily. Control data may be transferred between the first PCB, the second PCB, and/or the one or more relay PCBs, which may comprise one or more antennas. The relay PCBs may be dedicated relay PCBs or multi-purpose transmitter/receivers.

20 Claims, 5 Drawing Sheets

METHOD AND SYSTEM FOR INTER-PCB COMMUNICATIONS WITH WIRELINE CONTROL

CROSS-REFERENCE TO RELATED APPLICATIONS/INCORPORATION BY REFERENCE

The present application is a Continuation of U.S. application Ser. No. 12/056,865, filed Mar. 27, 2008 now U.S. Pat. No. 8,144,674.

FIELD OF THE INVENTION

Certain embodiments of the invention relate to communication systems. More specifically, certain embodiments of the invention relate to a method and system for inter-PCB communications with wireline control.

BACKGROUND OF THE INVENTION

Electronic communication has become prolific over the last decade. While electronic communication was initially limited to the desktop, recent trends have been to make communications, media content and the Internet available anytime, anywhere and, increasingly, on any device. Already now, it is quite common to find mobile devices such as cellular phones or Personal Digital Assistants (PDAs) that incorporate a large range of communication technologies and associated software. For example, fully-featured web-browsers, email clients, MP3 players, instant messenger software, and Voice-over-IP may all be found on some recent devices.

Currently, there are many different communication technologies and protocols, some of which may utilize common data formats and while others may utilize different data formats. Today's mobile communication devices have to support these many different communication technologies, protocols and/or data formats.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for PCB-to-PCB communications with wireline control, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for portable data storage with an integrated 60 GHz radio. Aspects of a method and system for portable data storage with an integrated 60 GHz radio may comprise setting up a microwave communication link between a first PCB and a second PCB via a wireline communication bus. The initialization may comprise adjusting beamforming parameters of a first antenna array communicatively coupled to the first PCB, and of a second antenna array communicatively coupled to the second PCB. The first PCB and the second PCB may communicate data via the microwave communication link.

The microwave communication link may be routed via one or more relay PCBs, when the first PCB and the second PCB cannot directly communicate satisfactorily. Control data may be transferred between the first PCB, the second PCB, and/or the one or more relay PCBs, which may comprise one or more antennas. The relay PCBs may be dedicated relay PCBs or multi-purpose transmitter/receivers. The first PCB and the second PCB may receive and/or transmit signals in the 60 GHz frequency band. The first antenna array and/or the second antenna array may be on an integrated circuit package, or on an integrated circuit of the first PCB and/or the second PCB, respectively. The first antenna array and the second antenna array may comprise one or more antennas. The beamforming parameters may be adjusted to optimize a communication link performance metric.

Figure 1:
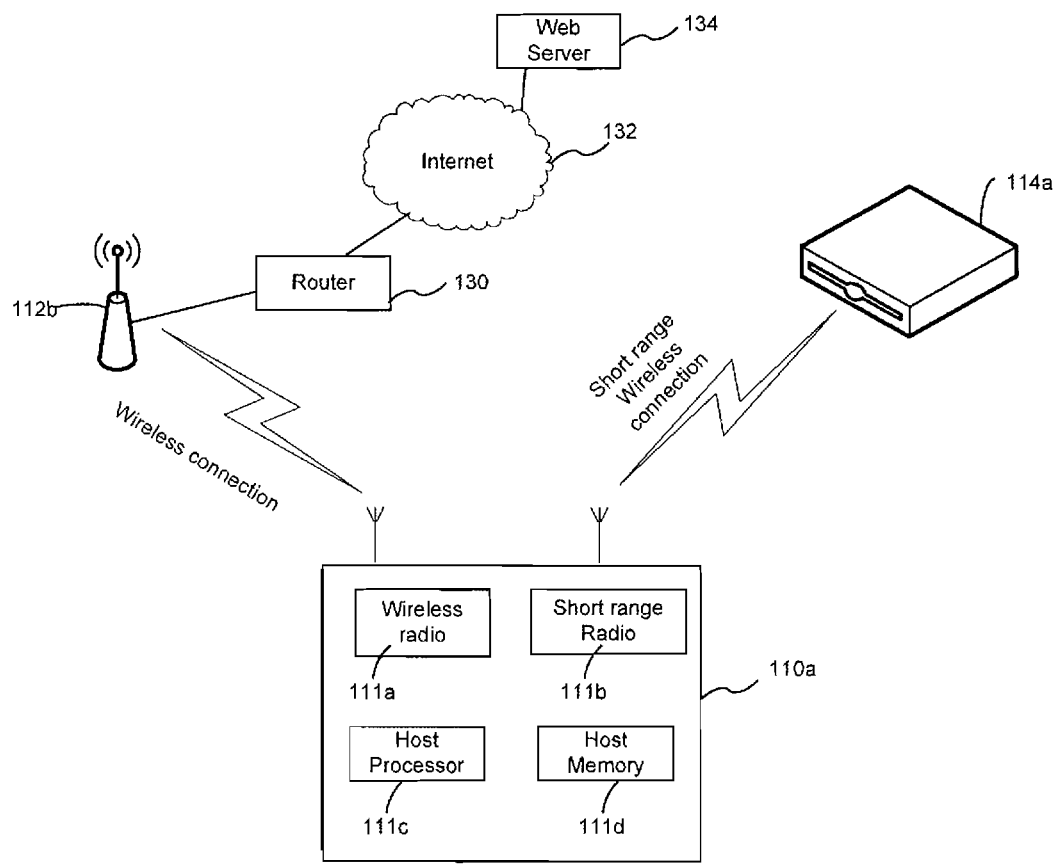
FIG. 1 is a diagram illustrating an exemplary wireless communication system, in accordance with an embodiment of the invention.

FIG. 1 is a diagram illustrating an exemplary wireless communication system, in accordance with an embodiment of the invention. Referring to FIG. 1, there is shown an access point 112b, a computer 110a, a portable storage 114a, a router 130, the Internet 132 and a web server 134. The computer or host device 110a may comprise a wireless radio 111a, a short-range radio 111b, a host processor 111c, and a host memory 111d. There is also shown a wireless connection between the wireless radio 111a and the access point 112b, and a short-range wireless connection between the short-range radio 111b and the portable storage 114a.

The access point 112b may comprise suitable logic, circuitry and/or code that may be enabled to transmit and receive radio frequency signals for data communications, for example with the wireless radio 111a. The access point 112b may also be enabled to communicate via a wired network, for example, with the router 130. The wireless radio 111a may comprise suitable logic, circuitry and/or code that may enable communications over radio frequency waves with one or more other radio communication devices. The wireless radio 111a and the access point 112b may be compliant with one or more mobile communication standards, for example, GSM, UMTS, and/or CDMA2000.

The short range radio 111b may comprise suitable logic, circuitry and/or code that may enable communications over radio frequencies with one or more other communication devices, for example the portable storage 114a. The short range radio 111b and/or the portable storage 114a may be compliant with a wireless industry standard, for example Bluetooth, ZigBee, and/or IEEE 802.11 Wireless LAN.

The host processor 111c may comprise suitable logic, circuitry and/or code that may be enabled to generate and process data. The host processor 111c may be a general purpose processor suitable for a computer 110a, or may be, for example, a PDA-like data processor for usage in a mobile communications computer or smartphone.

The host memory 111d may comprise suitable logic, circuitry and/or code that may be enabled to store and retrieve data for various system components and functions of the computer 110a. The host processor 111c may be enabled to store information within the host memory 111d and retrieved stored information from the host memory 111d.

The router 130 may comprise suitable logic, circuitry and/or code that may be enabled to communicate with various communication devices that may be communicatively coupled to it, for example, the access point 112b. The router 130 may be enabled to route communication between, for example, a wide area network (WAN) and/or a LAN or WLAN. The access point 112b and the Internet 132 may be coupled to the router 130. In this regard, the router 132 may be enabled to route traffic between the Internet and devices communicatively coupled to a WLAN via the access point 112b.

The Internet 132 may comprise various devices comprising suitable logic, circuitry and/or code that may enable interconnection and exchange of data between or among a plurality of communication devices communicatively coupled thereto. The web server 134 may comprise suitable logic, circuitry and/or code that may be communicatively coupled to the Internet 132 and may be enabled to provide web-based services to various communication devices that may be communicatively coupled to it. For example, the web server 134 may host one or more web sites that may be accessible via the communication devices.

Frequently, computing and communication devices may comprise hardware and software that may enable communication using multiple wireless communication standards and/or protocols. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a.

It may be desirable for the user of the computer 110a to access data from the portable storage 114a. Accordingly, the user of the computer 110a may establish a short-range wireless connection with the portable storage 114a. In some instances, a wireless connection between the portable storage 114a and the computer 110a may be using a Bluetooth, ZigBee, WiMax, IEEE 802.11 Wireless LAN, Ultrawideband, or 60 GHz communications protocol. When the short-range wireless connection is established, and with suitable configurations on the computer 110a enabled, data may be transferred from/to the portable storage 114a. In some instances, the data link between the portable storage 114a and the computer 110a may be enabled for high data rates. To achieve high data rates in compact devices, for example the portable storage 114a, wireless communication links to connect the components of a device. For example, the Printed Circuit Boards (PCBs) within the portable storage 114a may communicate data at high rate, for example in the Gbps range, via wireless links, for example via a 60 GHz microwave link.

Figure 2A:
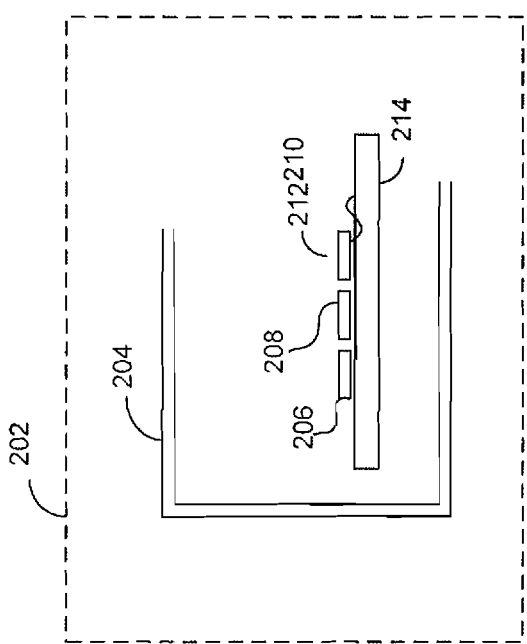
FIG. 2A is an illustration of a PCB-based antenna array, in accordance with an embodiment of the invention.

FIG. 2A is an illustration of a PCB-based antenna array, in accordance with an embodiment of the invention. Referring to FIG. 2A, there is shown a device 202. The device 202 may comprise a casing 204, and one or more printed circuit boards (PCBs) 214. The PCB 214 may comprise one or more antennas, of which antennas 206, 208 and 210 may be illustrated. In some instances, the device 202 may be, for example, a portable storage device.

The PCB 214 may comprise suitable logic, circuitry and/or code that may be enabled to generate and/or process radio frequency signals for reception and/or transmission via the one or more antennas, of which antennas 206, 208 and 210 may be illustrated. The antennas 206, 208, and 210 may be used together to form an antenna array. The antennas 206, 208 and 210 may be implemented on the PCB 214.

In accordance with various embodiments of the invention, a plurality of PCBs similar to PCB 214 illustrated in FIG. 2A may communicate together at high data rates via, for example, 60 GHz wireless links via antenna arrays that may be implemented on and/or in the PCB as described above.

In accordance with an embodiment of the invention, one or more communication links may be established between, for example, PCB 214 and other PCBs associated to the device 202. In addition, the antenna array comprising antennas 206, 208, and 210, for example, may be enabled to automatically steer the transmission and/or reception beam in a direction that may optimize the signal quality and hence the data rates that may be achievable.

Figure 2B:
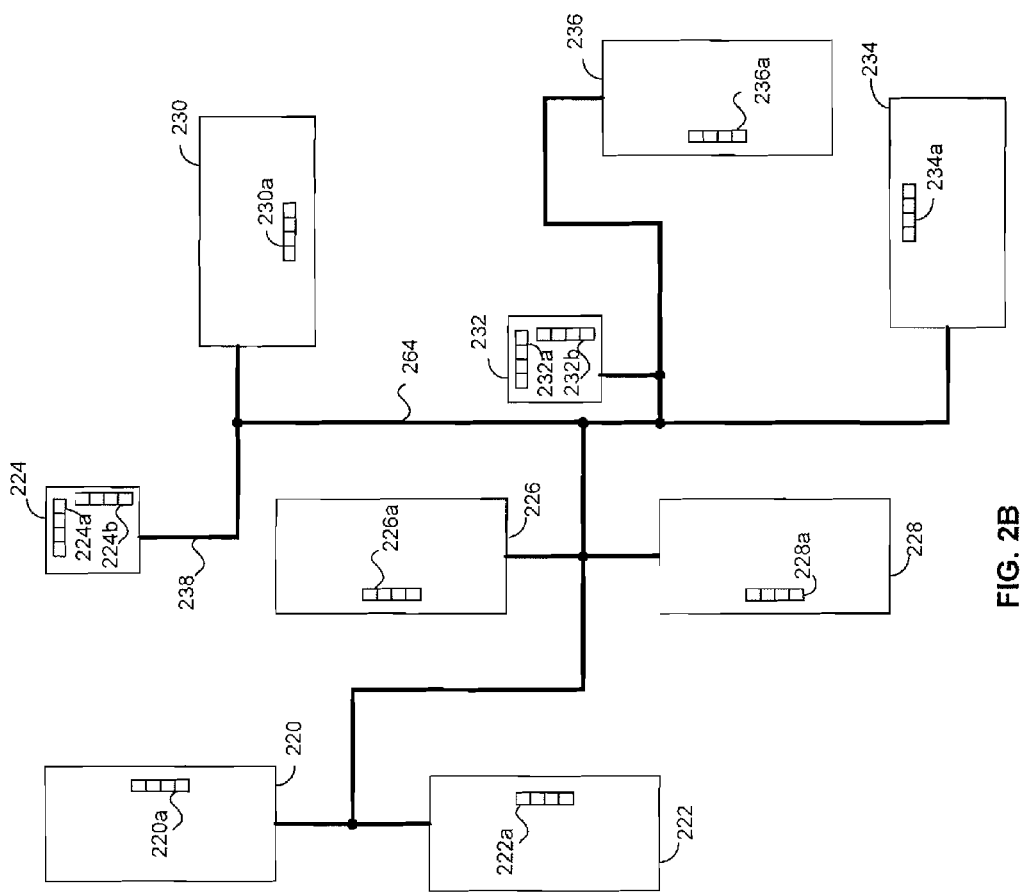
FIG. 2B is a diagram of a 60 GHz inter-PCB communication system, in accordance with an embodiment of the invention.

FIG. 2B is a diagram of a 60 GHz inter-PCB communication system, in accordance with an embodiment of the invention. Referring to FIG. 2B, there is shown a wireline communication bus 238, PCBs 220, 222, 226, 228, 230, 234, and 236. There is also shown relay PCBs 224 and 232.

Each of the PCBs 220, 222, 226, 228, 230, 234, and 236 may be substantially similar and may comprise suitable logic circuitry and/or code that may be enabled to communicate on one or more RF frequencies via corresponding antenna arrays. In an exemplary embodiment of the invention, each of the PCBs 220, 222, 226, 228, 230, 234, and 236 may comprise an antenna array 220a, 222a, 226a, 228a, 230a, 234a, and 236a, respectively. The PCB 220, for example, may comprise suitable logic, circuitry and/or code that may be enabled to communicate on radio-frequency frequencies via the antenna array 220a, and via the wireline communication bus 238. The PCBs 220, 222, 226, 228, 230, 234, and 236 may be communicatively coupled to the wireline bus 238.

Each of the relay PCBs 224 and 232 may be substantially similar may each comprise suitable logic circuitry and/or code that may be enabled to communicate on one or more RF frequencies via corresponding antenna arrays. The PCBs 224 and 232 may comprise one or more antenna arrays. For example, PCB 224 may comprise an antenna array 224a and an antenna array 224b. Similarly, the relay PCB 232 may comprise antenna arrays 232a and 232b, for example. In an exemplary embodiment of the invention, the relay PCB 232, for example, may comprise suitable logic, circuitry and/or code that may be enabled to communicate on radio-frequency frequencies via the antenna arrays 224a and 224b, and via wireline communication via the wireline communication bus 238. The relay PCBs 224 and 232 may be communicatively coupled to the wireline bus 238. In some instances, relay PCBs, for example relay PCBs 224 and 232, may be distinguished from other PCBs in that they may only forward data received via a radio link, and may not generally be the intended final recipients of data sent via a radio link. This may be, for example, the case for PCBs that may perform auxiliary functions that may not be directly involved in data processing, for example power supply PCBs.

The wireline bus 238 may comprise suitable, logic, circuitry and/or code that may be enabled to carry communication signal that may be sent and received by entities communicatively coupled to the wireline bus 238. The wireline bus 238 may be used as a low rate communication bus and as a control signal transport media that may be utilized to establish a high-rate 60 GHz radio communication link between or among a plurality of PCBs. For example, it may be desirable for the PCB 220 to communicate with the PCB 226. Via the wireline bus 238, the PCB 220 and/or the PCB 226 may initiate a communication session and parameters for a wireless radio connection may be exchanged. When the setup phase may be completed, the antenna array 220a on PCB 220 may be directed toward the antenna array 226a on PCB 226, and data may be exchanged wirelessly at a high-data rate. In some instances, one or more PCBs may not be able to directly communicate with another PCB. For example, the PCB 220 may desire to communicate with the PCB 236.

As illustrated in FIG. 2B, in some instances, the PCB 236 may not be in line of sight of the PCB 220a because the PCB 226 and the relay PCB 232, may be obstructing a direct wireless link from PCB 220 to PCB 236. In these instances, the communication may be routed via relay PCBs. The relay PCBs, for example the PCBs 224 and 232 may be enabled to receive communication data from one PCB and forward it to another PCB. For example, the PCB 220 may transmit to the PCB 236 via the relay PCB 224. In another embodiment of the invention, the PCB 220 may communicate with the PCB 236 via the relay PCB 224 and the PCB 232. Similarly, the PCB 222 may communicate with the PCB 234 via the relay PCB 232, for example. In accordance with various embodiments of the invention, the wireline bus 238 may be utilized to exchange control information and/or wireless link setup information. High-rate transfer may be achieved via the antennas, for example antenna array 220a, which are PCB-based.

Figure 2C:
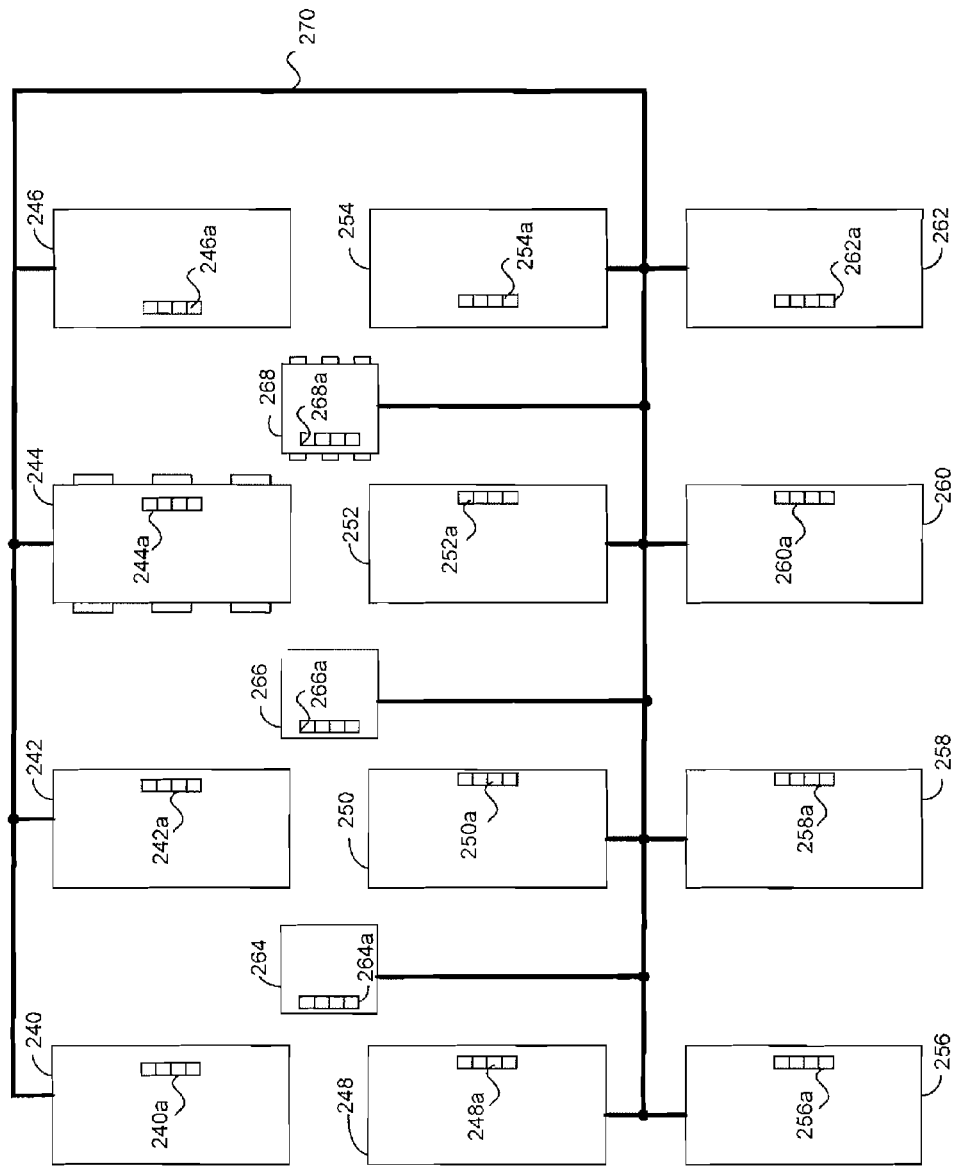
FIG. 2C is a diagram of a 60 GHz inter-PCB communication system, in accordance with an embodiment of the invention.

FIG. 2C is a diagram of a 60 GHz inter-PCB communication system, in accordance with an embodiment of the invention. Referring to FIG. 2C, there is shown a wireline communication bus 270, PCBs 240, 242, 244, 246, 248, 250, 252, 254, 256, 258, 260 and 262. There is also shown relay PCBs 264, 266, and 268.

The PCBs 240, 242, 244, 246, 248, 250, 252, 254, 256, 258, 260 and 262 may be substantially similar. For example, each of the PCBs 240, 242, 244, 246, 248, 250, 252, 254, 256, 258, 260 and 262 may comprise an antenna array 240a, 242a, 244a, 246a, 248a, 250a, 252a, 254a, 256a, 258a, 260a and 262a, respectively. The PCBs 240, 242, 244, 246, 248, 250, 252, 254, 256, 258, 260 and 262 may be communicatively coupled to the wireline communication bus 270.

The PCB 240, for example, may comprise suitable logic, circuitry and/or code that may be enabled to communicate on radio-frequency frequencies via the antenna array 240a, and via the wireline communication bus 270.

Each of the relay PCBs 264, 266, and 268 may be substantially similar to PCB 240. The relay PCBs 264, 266, and 268 may comprise one or more antenna arrays. For example, the relay PCB 264 may comprise an antenna array 264a. The relay PCB 264, for example, may comprise suitable logic, circuitry and/or code that may be enabled to communicate on radio-frequency frequencies via the antenna arrays 264a, and via wireline communication via the wireline communication bus 270. The relay PCBs 264, 266, and 268 may be communicatively coupled to the wireline communication bus 270.

Similar to FIG. 2B, the wireline communication bus 270 may be used to exchange control information and setup a 60 GHz wireless connection between or among a plurality of PCBs. In some instances, a regular grid of PCBs as illustrated in FIG. 2C may be utilized. As illustrated, because of the wireless links, various embodiments of the invention may comprise a high density of PCBs since fewer physical connections may be required. For example, the PCB 256 may desire to communicate with the PCB 244. The communication parameters may be exchanged via the wireline communication bus 270, and a wireless communication may be initialized. In this instance, the PCB 256 may steer its antenna array 256a toward the relay PCB 264. The relay PCB 264 may relay messages from, and to the PCB 256 via the relay PCB 266 and/or the relay PCB 268. In accordance with various embodiments of the invention, the relay PCBs may be dedicated relay PCBs and/or multi-purpose transmitter/receiver PCBs that may be enabled to initiate communication sessions on their own. As described above for FIG. 2A, dedicated relay PCBs, for example relay PCBs 264, 266, and 268, may be distinguished from other PCBs in that they may only forward data received via a radio link, and may not generally be the intended final recipients of data sent via a radio link, for example a microwave link. This may be, for example, the case for PCBs that may perform auxiliary functions that may not be directly involved in data processing, for example power supply PCBs. Conversely, multi-purpose transmitter/receiver PCBs, for example PCBs 240, 242, or 244 may be enabled to relay received radio signal, but may also be the intended final recipient of signals that they may receive, for example via a microwave link.

Figure 3:
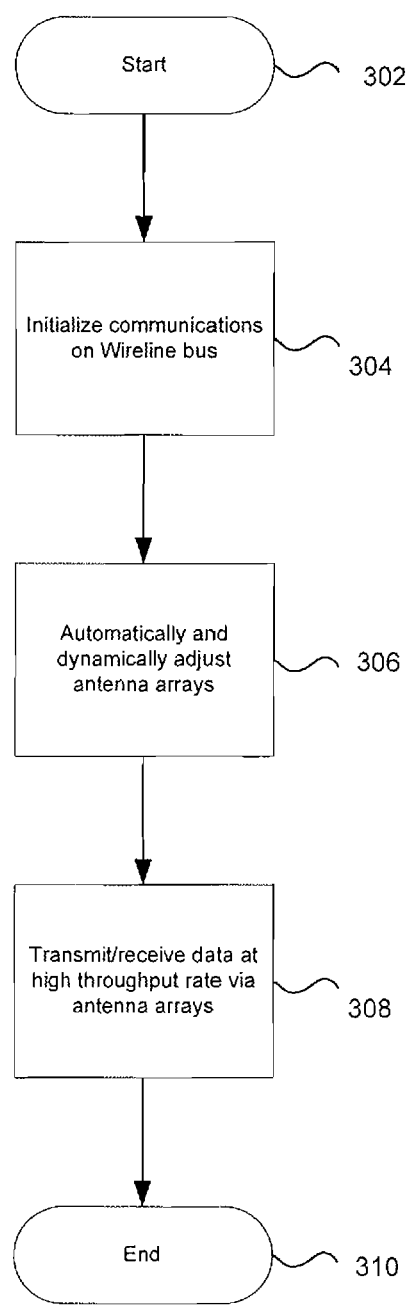
FIG. 3 is a flow chart illustrating an exemplary communication setup, in accordance with an embodiment of the invention.

FIG. 3 is a flow chart illustrating an exemplary communication setup, in accordance with an embodiment of the invention. The communication setup process may be initialized in step 302. In step 304, the initial communications setup may be established, for example between the PCB 250 and the PCB 254, as illustrated in FIG. 2C. In accordance with various embodiments of the invention, the initialization of the communication may be achieved via a wireline bus, for example the wireline communication bus 270, as described with respect to at least FIG. 2B and FIG. 2C. In step 306, after the connection has been set up, the 60 GHz antenna arrays on the PCB, for example PCB 250, may automatically and/or dynamically adjust their beam patterns in order to optimize some communication performance parameters. For example, the beams may be adjusted in order to optimize signal strength, Signal-to-Interference-and-Noise-Ratio (SINR), packet error rate (PER) or bit error rate (BER). The beam patterns and parameters may be adjusted, for example through transmitted and received training data. In step 308, the transmission and reception of the data through the antenna arrays may take place. In some instances, a plurality of communicating PCBs may be required to transmit and/or receive data via relay PCBs, for example relay PCBs 264, 266, and 268.

In accordance with an embodiment of the invention, a method and system for inter-PCB communications with wireline control may comprise setting up a microwave communication link between a first PCB, for example PCB 222, and a second PCB, for example 234, via a wireline communication bus 238. The initialization may comprise adjusting beamforming parameters of a first antenna array, for example 222a, communicatively coupled to the first PCB 222, and a second antenna array, for example 234a, communicatively coupled to the second PCB 234. The first PCB, for example PCB 222, and the second PCB, for example PCB 234, may communicate data via said microwave communication link, as described in FIG. 2B and FIG. 2C. The microwave communication link may be routed via one or more relay PCBs, for example relay PCB 232, when the first PCB, for example PCB 222, and the second PCB, for example PCB 234, cannot directly communicate. Control data may be transferred between the first PCB 222, the second PCB 234, and/or the one or more relay PCBs, for example relay PCB 232, which may comprise one or more antennas, for example antennas 232a and 232b. The relay PCBs may be dedicated relay PCBs or multi-purpose transmitter/receivers. The first PCB and the second PCB may receive and transmit in the 60 GHz frequency band. The first antenna array and/or the second antenna array may be on an integrated circuit package, or on an integrated circuit of the first PCB and/or the second PCB, respectively, as illustrated in FIG. 2A, for example. The first antenna array and the second antenna array may comprise one or more antennas. The beamforming parameters may be adjusted to optimize a microwave communication link performance metric.

Another embodiment of the invention may provide a machine-readable storage, having stored thereon, a computer program having at least one code section executable by a machine, thereby causing the machine to perform the steps as described herein for a method and system for inter-PCB communications with wireline control.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A communication method comprising:
   setting up a microwave communication link between a first printed circuit board (PCB) and a second PCB via a wireline communication bus;
   after said setting up, transferring parameters between said first PCB and said second PCB via said wireline communication bus for configuring said microwave communication link; and
   after said configuring, communicating data between said first PCB and said second PCB via said microwave communication link.

2. The method according to claim 1, comprising routing said microwave communication link via one or more relay PCBs, when said first PCB and said second PCB cannot directly communicate.

3. The method according to claim 2, wherein said one or more relay PCBs comprise one or more antennas.

4. The method according to claim 2, wherein said relay PCBs are dedicated relay PCBs.

5. The method according to claim 2, wherein said relay PCBs are multi-purpose transmitter/receivers.

6. The method according to claim 1, wherein said first PCB and said second PCB receive and transmit in a 60 GHz frequency band.

7. The method according to claim 1, wherein a first antenna array is communicatively coupled to said first PCB and is on an integrated circuit package, or on an integrated circuit of said first PCB.

8. The method according to claim 7, wherein said first antenna array comprises one or more antennas.

9. The method according to claim 8, wherein a second antenna array is communicatively coupled to said first antenna array and is on an integrated circuit package, or on an integrated circuit of said second PCB.

10. A communication system comprising:
    one or more circuits in a first printed circuit board (PCB);
    one or more circuits in a second PCB;
    a wireline communication bus;
    wherein said one or more circuits in each of said first PCB and said second PCB are configured to perform:
      setting up a microwave communication link between said first PCB and a second PCB via said wireline communication bus;
      after said setting up, transferring parameters between said first PCB and said second PCB via said wireline communication bus for configuring said microwave communication link; and
      after said configuring, communicating data between said first PCB and said second PCB via said microwave communication link.

11. The system according to claim 10, wherein the system having a transmitter configured to route said microwave communication link via one or more relay PCBs, when said first PCB and said second PCB cannot directly communicate.

12. The system according to claim 11, wherein said one or more relay PCBs comprise one or more antennas.

13. The system according to claim 11, wherein said relay PCBs are dedicated relay PCBs.

14. The system according to claim 11, wherein said relay PCBs are multi-purpose transmitter/receivers.

15. The system according to claim 10, wherein said first PCB and said second PCB receive and transmit in a 60 GHz frequency band.

16. The system according to claim 10, wherein a first antenna array is communicatively coupled to said first PCB and is on an integrated circuit package, or on an integrated circuit of said first PCB.

17. The system according to claim 16, wherein said first antenna array comprises one or more antennas.

18. The system according to claim 17, wherein a second antenna array is communicatively coupled to said first antenna array and is on an integrated circuit package, or on an integrated circuit of said second PCB.

19. A first printed circuit board (PCB) comprising:
one or more circuits;
wherein said one or more circuits are configured to perform:
  setting up a microwave communication link between said first PCB and a second PCB via a wireline communication bus;
  after said setting up, communicating parameters with said second PCB via said wireline communication bus for configuring said microwave communication link; and
  after said configuring, communicating data with said second PCB via said microwave communication link.

20. A communication method for use by a first printed circuit board (PCB), the method comprising:
setting up a microwave communication link with a second PCB via a wireline communication bus;
after said setting up, communicating parameters with said second PCB via said wireline communication bus for configuring said microwave communication link; and
after said configuring, communicating data with said second PCB via said microwave communication link.

* * * * *